United States Patent
Hearn et al.

(10) Patent No.: US 7,505,349 B2
(45) Date of Patent: Mar. 17, 2009

(54) REFRESH SEQUENCE CONTROL FOR MULTIPLE MEMORY ELEMENTS

(75) Inventors: Chris Hearn, St. Pete Beach, FL (US);
Dean W. Brenner, Largo, FL (US);
Scott D. Stackelhouse, Tigard, OR (US);
Fernando M. Garcia, Palm Harbor, FL (US)

(73) Assignee: Honeywell International Inc., Morristown, NJ (US)

( * ) Notice: Subject to any disclaimer, the term of this patent is extended or adjusted under 35 U.S.C. 154(b) by 335 days.

(21) Appl. No.: 11/470,903

(22) Filed: Sep. 7, 2006

(65) Prior Publication Data

US 2008/0062797 A1 Mar. 13, 2008

(51) Int. Cl.
*G11C 7/00* (2006.01)

(52) U.S. Cl. .................. 365/222; 365/194; 365/230.03; 365/233.13

(58) Field of Classification Search .................. 365/222, 365/189.17, 194, 230.03, 233.13
See application file for complete search history.

(56) References Cited

U.S. PATENT DOCUMENTS

| | | | |
|---|---|---|---|
| 5,208,782 A | 5/1993 | Sakuta et al. | |
| 5,289,377 A | 2/1994 | Yokote et al. | |
| 5,535,169 A * | 7/1996 | Endo et al. | 365/189.04 |
| 5,761,703 A | 6/1998 | Bolyn | |
| 6,226,755 B1 | 5/2001 | Reeves | |
| 6,330,639 B1 | 12/2001 | Fanning et al. | |
| 6,646,942 B2 | 11/2003 | Janzen | |
| 6,785,178 B2 * | 8/2004 | Shimoyama | 365/203 |
| 6,914,841 B1 | 7/2005 | Thwaite | |
| 6,930,944 B2 * | 8/2005 | Hush | 365/222 |
| 2001/0043507 A1 | 11/2001 | Ooishi | |
| 2005/0078538 A1 | 4/2005 | Hoehler | |
| 2005/0108460 A1 | 5/2005 | David | |
| 2006/0044909 A1 | 3/2006 | Kinsley et al. | |

OTHER PUBLICATIONS

Aldereguia et al., "Staggered Refresh Memory for Personal Computer Systems", "IBM Technical Disclosure Bulletin", Oct. 1993, pp. 223-226, vol. 36, No. 10, Publisher: IP.com, Inc.
Arroyo et al., "Automatic Detection/Implementation of Staggered Refresh", "IBM Technical Disclosure Bulletin", Nov. 1, 1989, pp. 456-457, Publisher: IP.com, Inc.

* cited by examiner

*Primary Examiner*—Richard Elms
*Assistant Examiner*—Toan Le
(74) *Attorney, Agent, or Firm*—Fogg & Powers LLC

(57) ABSTRACT

A method for controlling a refresh sequence for multiple memory elements within an electronic device is disclosed. The method involves adjusting a programmable signal delay to avoid a simultaneous memory refresh between two or more of the multiple memory elements and passing a refresh signal from one memory element to another memory element based on the programmable signal delay.

20 Claims, 4 Drawing Sheets

US 7,505,349 B2

REFRESH SEQUENCE CONTROL FOR MULTIPLE MEMORY ELEMENTS

GOVERNMENT INTEREST STATEMENT

The U.S. Government may have certain rights in the present invention as provided for by the terms of a restricted government contract.

BACKGROUND

Synchronous dynamic random access memory (SDRAM) is one type of computer-based device memory. While standard forms of DRAM have an asynchronous interface (that is, an interface that reacts immediately to changes in control inputs), SDRAM has a synchronous interface, meaning that it waits for a clock signal before responding to control inputs. SDRAM synchronizes with the computer-based device's system bus and processor.

Current electronic circuit designs are migrating from single data rate (SDR) SDRAM to double data rate (DDR) SDRAM to adjust for changing industry needs. With DDR SDRAM, data is clocked both on the rising edge and on the falling edge of the clock, and effectively doubling the raw bandwidth over SDR SDRAM. Today, multiple instances of DDR SDRAM are widely used in computers, servers, storage, and networking and communication equipment. DDR SDRAM is quickly becoming the standard for high-density, low-cost memory designs.

Dynamic memory devices (such as DDR SDRAM) require a periodic refresh (that is, an electrical charge) to keep memory contents (data) intact. The high levels of instantaneous current required for refreshing multiple high-density DDR SDRAM elements is unsustainable for the typical power sources used in the computer-based devices described above. Overcompensating for these instantaneous current demands with additional electrical energy increases power consumption and results in a less efficient electronic circuit design.

SUMMARY

The following specification addresses refresh sequence control for multiple memory elements that reduces instantaneous current demands in electronic devices. Particularly, in one embodiment, a method for controlling a refresh sequence for multiple memory elements within an electronic device is provided. The method involves adjusting a programmable signal delay to avoid a simultaneous memory refresh between two or more of the multiple memory elements and passing a refresh signal from one memory element to another memory element based on the programmable signal delay.

DRAWINGS

These and other features, aspects, and advantages will become better understood with regard to the following description, appended claims, and accompanying drawings where:

Like reference numbers and designations in the various drawings indicate like elements.

DETAILED DESCRIPTION

Figure 1:
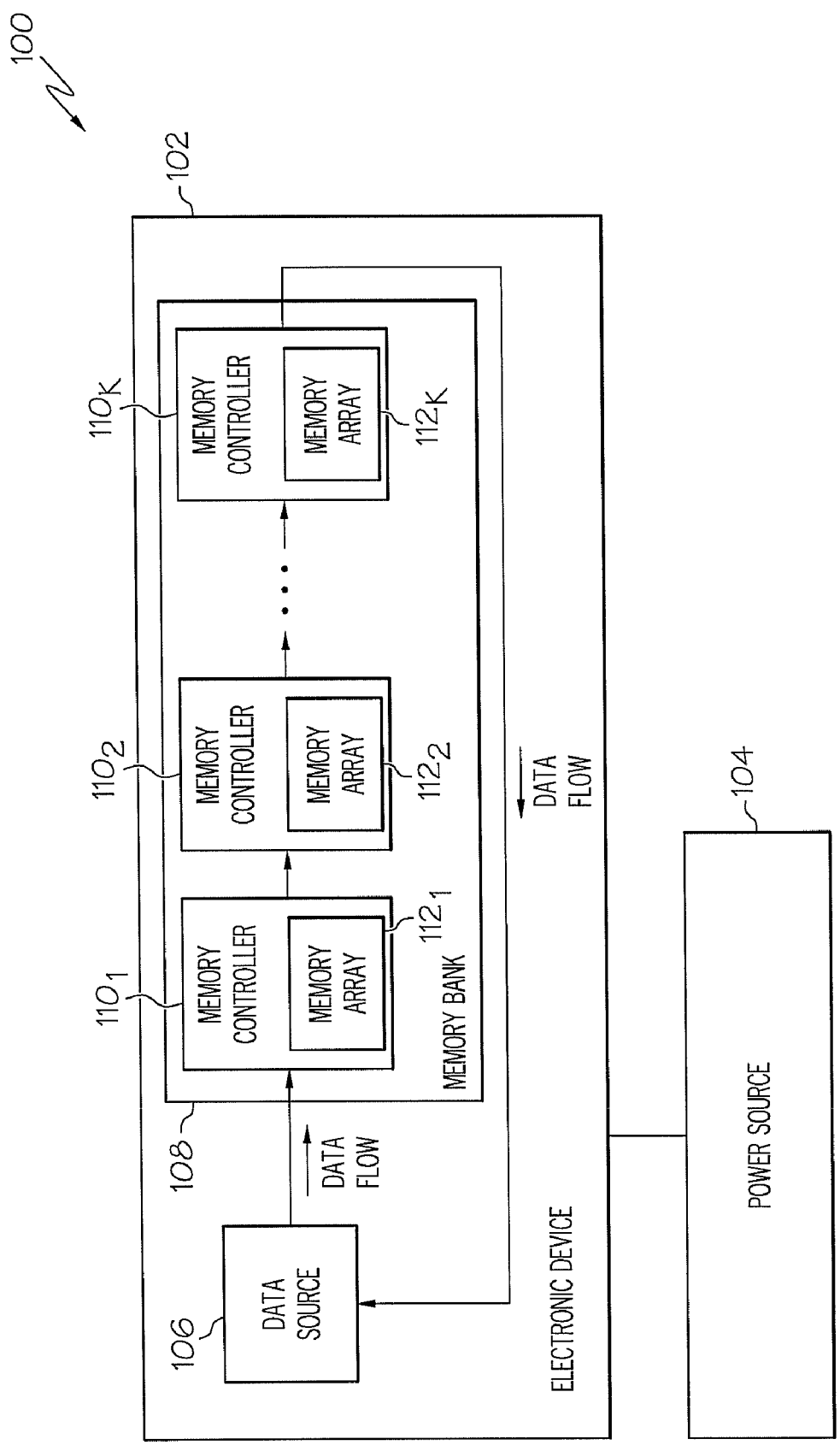
FIG. 1 is a block diagram of an embodiment of an electronic assembly.

FIG. 1 is a block diagram of an embodiment of an electronic assembly 100. The electronic assembly 100 comprises an electronic device 102 and a power source 104. The electronic device 102 further comprises at least one memory bank 108 responsive to at least one data source 106. In the example embodiment of FIG. 1, the power source 104 provides (at a minimum) electrical power to the at least one data source 106 and the at least one memory bank 108. In one implementation, the data source 106 is an electronic computing element such as an application-specific integrated circuit (ASIC), a field-programmable gate array (FPGA), a field-programmable object array (FPOA), a programmable logic device, and the like, that contains one or more sets of appropriate program instructions configured to receive data from, and transmit data to, the at least one memory bank 108. The at least one memory bank 108 further comprises memory controllers $110_1$ to $110_K$. In the example embodiment of FIG. 1, each of the memory controllers $110_1$ to $110_K$ further includes a corresponding memory array $112_1$ to $112_K$. Each memory controller $110_1$ to $110_K$ and memory array $112_1$ to $112_K$ combination comprises, without limitation, a DDR SDRAM memory controller element (module). It is noted that for simplicity in description, a total of three memory controllers 110 are shown in FIG. 1. However, it is understood that in other embodiments of the electronic assembly 100 different numbers of the memory controllers 110 (for example, one or more memory controllers 110) are used. Each of the memory controllers $110_1$ to $110_K$ are coupled to the data source 106 to provide a continuous data flow as illustrated in FIG. 1.

In operation, the electronic device 102 controls a refresh sequence for each of the memory controllers $110_1$ to $110_K$ (memory arrays $112_1$ to $112_K$) that effectively distributes current drawn from the power source 104 over time through the at least one memory bank 108. The refresh sequence controlled by the electronic device 102 reduces instantaneous current demands on the power source 104. The power source 104 supplies the data source 106 and the at least one memory bank 108 with the electrical energy required to operate the electronic device 102. To keep data contents of the electronic device 102 refreshed (that is, updated), the data source 106 periodically issues a refresh signal to the memory bank 108. The refresh signal causes data in each memory cell of the memory arrays $112_1$ to $112_K$ to be effectively rewritten (that is, restored). A refresh of each memory cell within the memory arrays $112_1$ to $112_K$ maintains an electrical charge (that is, the data) in each of the memory arrays 112.

In the example embodiment of FIG. 1, the memory controller $110_1$ receives the refresh signal from the at least one data source 106. The memory controller $110_1$ sequences each memory refresh of the remaining memory controllers 110 (memory arrays 112) with the refresh signal. In one implementation, and before the refresh signal is propagated to the memory controller $110_1$, a programmable delay value within the memory controller $110_1$ is calculated (as discussed below). The programmable delay value is adjustable based on a number of memory banks 108 in the electronic device 102. Moreover, calculating the programmable delay value in this implementation of FIG. 1 is illustrated below with respect to Equation 1.

$$\text{Programmable Delay Value} = \frac{\text{Memory Controller Refresh Rate}}{\text{Number of Memory Banks}} \quad \text{(Equation 1)}$$

As illustrated in Equation 1 above, the programmable delay value is further dependent upon a prescribed refresh rate for each of the memory controllers $110_1$ to $110_K$. In one implementation, the prescribed refresh rate is 64 ms. Alternate refresh rates are possible. At least one alternate implementation of the electronic assembly 100 that further illustrates Equation 1 is discussed in detail below with respect to FIG. 3.

After a time period equal to the programmable delay value occurs, the refresh sequence continues at the memory controller $110_2$ until each of the memory controllers 110 are refreshed. Similar subsequent refreshes to the memory controllers 110 within the at least one memory bank 108 are adapted to reduce instantaneous power demands from the power source 104 to an acceptable level during each memory refresh. In one implementation, and before each new refresh sequence occurs, the electronic device 103 determines whether the programmable delay value has been modified. Sequencing subsequent refreshes of the memory controllers 110 avoids any simultaneous refreshes while propagating the refresh signal through the entire memory bank 108. By sequencing the memory controllers 110 as discussed above, the power source 104 distributes an effective amount of electrical energy for the electronic device 102 to operate at nominal current levels.

Figure 2:
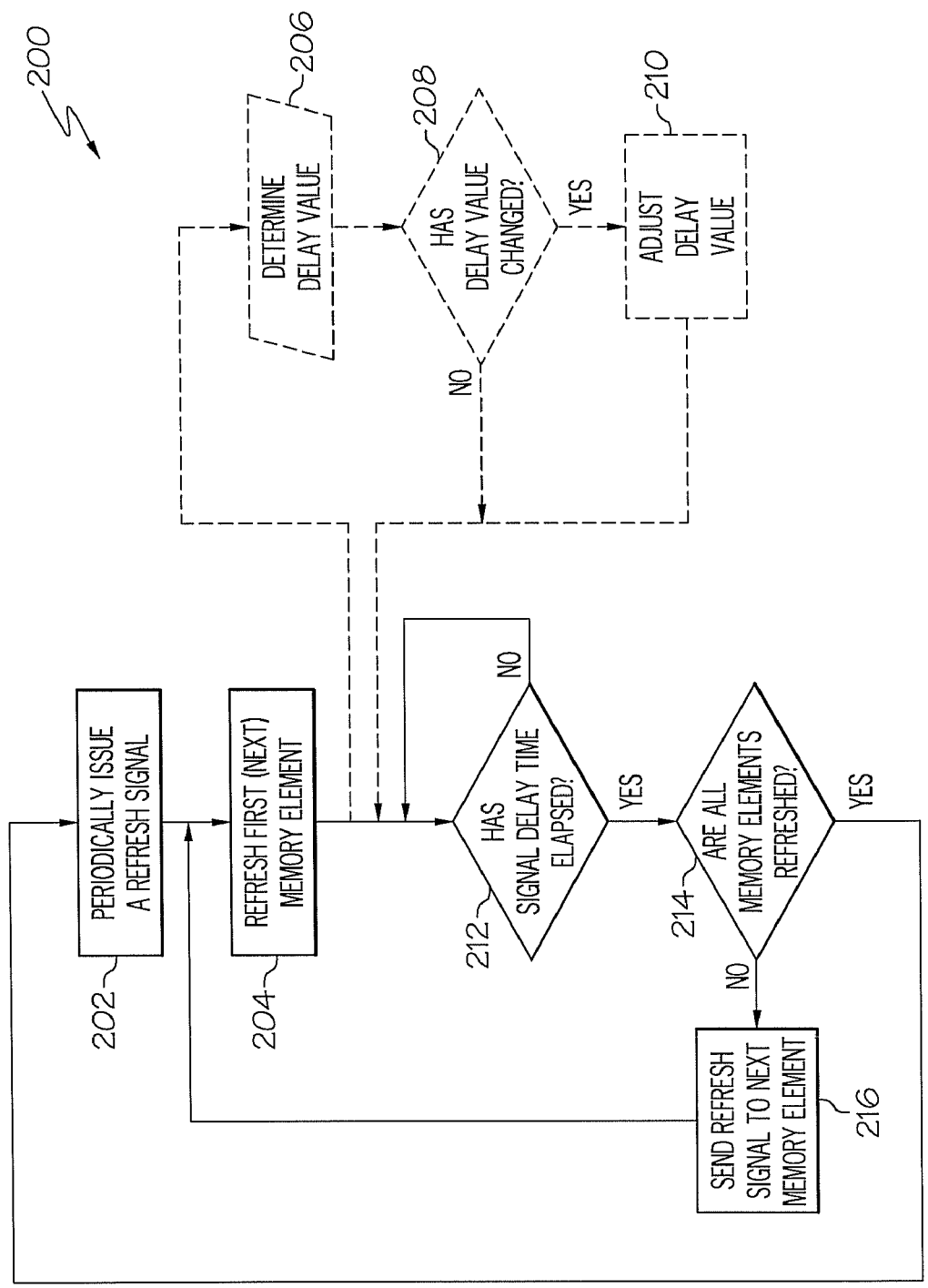
FIG. 2 is a flow diagram illustrating an embodiment of a method for refreshing memory in the electronic assembly of FIG. 1.

FIG. 2 is a flow diagram illustrating a method 200 for refreshing memory in the electronic assembly 100 of FIG. 1. In an example embodiment, after the at least one data source 106 periodically issues a refresh signal at block 202, the method 200 begins refreshing the first (next) memory element (for example, the memory controller $110_1$) in sequence at block 204. A primary function of the method 200 is to sequence subsequent refreshes to the one or more memory controllers 110 within the at least one memory bank 108. The method 200 reduces instantaneous power demands on the electronic device 102 (and in particular, demands on the power source 104) to an acceptable level during each memory refresh.

In one implementation, the method 200 provides an optional check to determine whether the programmable delay value (block 206) has been modified in the electronic device 102 (block 208). If the programmable delay value is different than when a previous refresh sequence was performed, the programmable delay value is adjusted for the memory controllers 110 at block 210. If the programmable delay value equals the stored value in the electronic device 102 (or the delay value is a fixed value), the method 200 continues at block 212. At block 212, the method 200 determines if a time period equal to the programmable delay value has elapsed. Once the time period elapses, a check is made (block 214) to determine if all of the memory controllers 110 have been refreshed during the current refresh cycle. If not all of the memory controllers 110 have been refreshed, the refresh signal is sent to the next memory element (for example, the memory controller $110_2$) at block 216.

Figure 3:
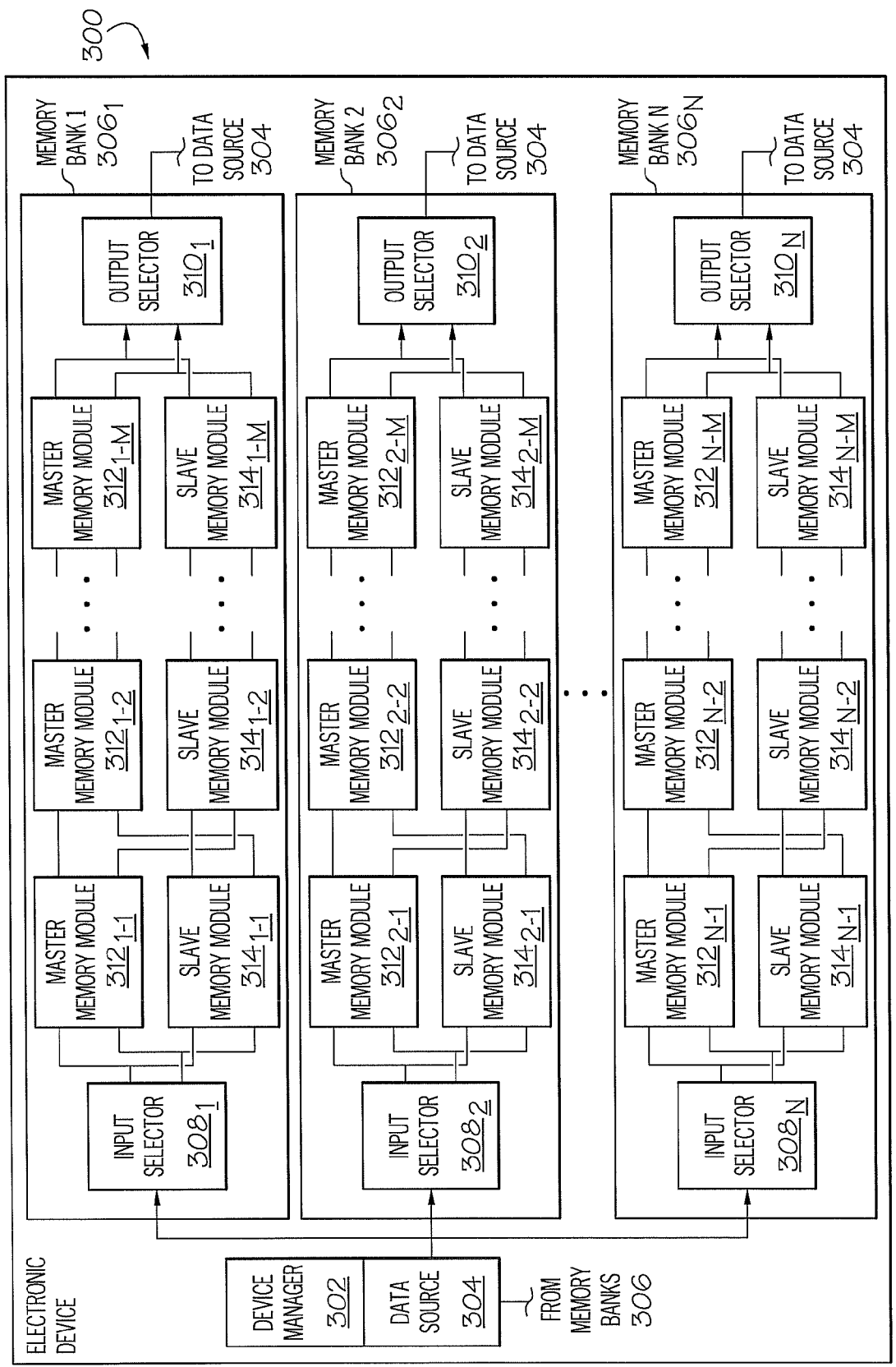
FIG. 3 is a block diagram of an alternate embodiment of the electronic device within the electronic assembly of FIG. 1.

As noted above, FIGS. 1 and 2 illustrate one embodiment of the electronic assembly 100, the electronic device 102, and at least one associated method 200, respectively. It is to be understood that other embodiments are implemented in other ways. Indeed, the electronic device 102 illustrated in FIGS. 1 and 2 is adaptable for a wide variety of applications. For example, FIG. 3 is a block diagram of an alternative embodiment of the electronic device 102, an electronic device 300. The embodiment of the electronic device 300 shown in FIG. 3 includes at least three memory banks 306. The three memory banks 306 are individually referenced in FIG. 3 as memory banks $306_1$, $306_2$, and $306_N$, respectively. It is understood that the electronic device 300 is capable of accommodating any appropriate number of the memory banks 306 (for example, at least one memory bank) in a single electronic device 302.

In the embodiment shown in FIG. 3, the electronic device 300 further comprises a device manager 302 and at least one data source 304. The device manager 302 is responsible for the configuration and control of the at least one data source 304 and each of the memory banks 306. The device manager 302 is further responsible for managing a data flow from the at least one data source 304 through each of the memory banks $306_1$ to $306_N$. The at least one data source 304 maintains one or more data sources for each of the memory banks $306_1$ to $306_N$. The at least one data source 304 is coupled to each of the memory banks $306_1$ to $306_N$ by a respective input selector $308_1$ to $308_N$. The three input selectors 308 are individually referenced in FIG. 3 as input selectors $308_1$ (memory bank 1), $308_2$ (memory bank 2), and $308_N$ (memory bank N), respectively. To complete a data flow between each of the memory banks $306_1$ to $306_N$, the at least one data source 304 is further coupled to a respective output selector $310_1$ to $310_N$. The three output selectors 310 are individually referenced in FIG. 3 as output selectors $310_1$ (memory bank 1), $310_2$ (memory bank 2), and $310_N$ (memory bank N), respectively.

Between the input selectors 308 and the output selectors 310, the embodiment of the electronic device 302 shown in FIG. 3 includes at least two rows of at least one memory module each, master memory modules 312 and slave memory modules 314. In one implementation, each of the memory modules shown in FIG. 3 are identical to the memory controller and array combinations (for example, memory controller $110_1$ and memory array $112_1$) described above with respect to FIG. 1. Each of the master (slave) memory modules 312 (314) are responsive to at least two input signals from one of the respective input selectors $308_1$ to $308_N$. Within the memory bank $306_1$, for example, the memory modules are individually referenced in FIG. 3 as master memory modules $312_{1-1}$ to $312_{1-M}$, and slave memory modules $314_{1-1}$ to $314_{1-M}$, respectively. With respect to the memory bank $306_2$, the memory modules are individually referenced in FIG. 3 as master memory modules $312_{2-1}$ to $312_{2-M}$, and slave memory modules $314_{2-1}$ to $314_{2-M}$, respectively. With respect to the memory bank $306_N$, the memory modules are individually referenced in FIG. 3 as master memory modules $312_{N-1}$ to $312_{N-M}$, and slave memory modules $314_{N-1}$ to $314_{N-M}$, respectively. It is understood that each of the memory banks $306_1$ to $306_N$ are capable of accommodating any appropriate number of the master memory modules 312 and the slave memory modules 314 (for example, at least one row of master memory modules and at least one row of slave memory modules) in a single electronic device 302.

Each set of the master memory modules 312 and the slave memory modules 314 are coupled between respective input selectors $308_1$ to $308_N$ and respective output selectors $310_1$ to $310_N$ as illustrated in FIG. 3. Moreover, each set of the master (slave) memory modules 312 (314) comprise one or more reconfigurable memory elements. In one implementation, a current status of the master (slave) memory modules 312 (314) within each of the one or more reconfigurable memory elements is interchangeable (that is, the device manager 302 is capable of configuring any of the master memory modules 312 as a slave memory module 314, as well as configuring any of the slave memory modules 314 as a master memory module 312).

In operation, the device manager 302 provides the at least one data source 304 with a data flow configuration for each periodic refresh of each of the memory banks $306_1$ to $306_N$. In the example embodiment of FIG. 3, the device manager 302 further instructs the input selectors 308 and the output selectors 310 to route a refresh signal through either the master (slave) memory modules 312 (314) before the refresh signal returns to the data source 304. Similar to electronic device 102, the device manager 302 sequences the refresh signal through each of the master (slave) memory modules 312 (314) with the at least one data source 304. Before the refresh signal is propagated to the master (slave) memory modules 312 (314), a programmable delay value within the master (slave) memory modules 312 (314) is reviewed by the device manager 304. Similar to the implementation outlined in FIG. 1 above, the programmable delay value is based on a number of memory banks 306 in the electronic device 300 and a prescribed refresh rate for each of the master (slave) memory modules 312 (314). In one implementation, and based on the programmable delay value, each of the input selectors 308 issue the refresh signal to each master memory module 312 (for example, the master memory module $312_{1\text{-}1}$) and each slave memory module 314 (for example, the master memory module $314_{1\text{-}1}$). Once a time period equal to the programmable delay value has occurred, the refresh sequence continues at each of the remaining master (slave) memory modules 312 (314) until each of the memory banks $306_1$ to $306_N$ are refreshed. In the same implementation, each master memory module 312 propagates the refresh signal to the next set of master (slave) memory modules 312 (314). For example, the master memory module $312_{1\text{-}1}$ propagates the refresh signal to first the master memory module $312_{1\text{-}2}$ and then to the slave memory module $314_{1\text{-}2}$ in sequence as prescribed by the programmable delay value. In the example embodiment of FIG. 3, the slave memory modules 314 do not propagate the refresh signal. In the same or alternate implementations, each of the one or more reconfigurable memory elements provide one or more data flow configuration options for the electronic device 300 (for example, if the master memory modules $312_{2\text{-}1}$ does not operate, the corresponding slave memory modules $314_{2\text{-}1}$ is configured as a master to continue propagation of the refresh signal within the memory bank $306_2$).

The electronic device 300 sequences subsequent refreshes to the master memory modules 312 (the slave memory modules 314) within each of the memory banks $306_1$ to $306_N$ to reduce instantaneous current levels within the electronic device 300 during each memory refresh. Before each new memory refresh sequence begins, the electronic device 300 determines whether the programmable delay value has been modified. Sequencing subsequent refreshes of the master memory modules 312 (the slave memory modules 314) avoids any simultaneous refreshes when propagating the at refresh signal through each of the memory banks $306_1$ to $306_N$. By refreshing each of the master (slave) memory modules 312 (314) during a different time period, the electronic device 300 does not exceed nominal (maximum) operating current levels.

Figure 4:
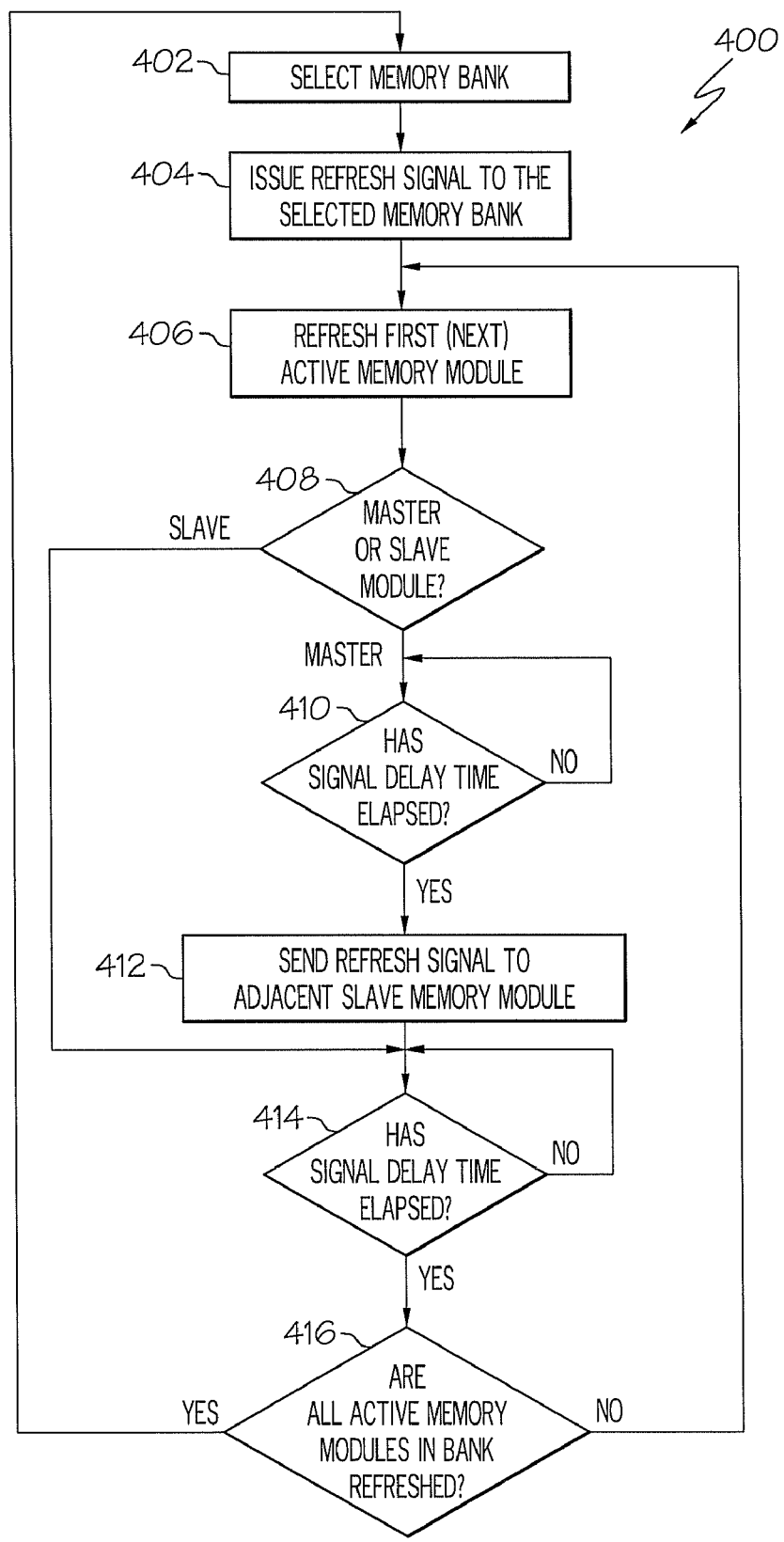
FIG. 4 is a flow diagram illustrating an embodiment of a method for controlling a refresh sequence for multiple memory elements within the electronic device of FIG. 3.

FIG. 4 is a flow diagram illustrating a method 400 for controlling a refresh sequence for multiple memory elements within the electronic device 300 of FIG. 3. In an example embodiment, one of the memory banks $306_1$ to $306_3$ are selected for refresh at block 402. Once the at least one data source 304 periodically issues a refresh signal to the selected memory bank 306 (block 404), method 400 begins refreshing the first (next) master (slave) memory module 312 (314) in sequence (for example, the master memory module $312_{1\text{-}1}$) at block 406. A primary function of the method 400 is to continuously sequence a memory refresh for each of the one or more master (slave) memory modules 312 (314) within each of the memory banks $306_1$ to $306_N$. Similar to the method 200 of FIG. 2, this sequencing reduces instantaneous power demands on the electronic device 300 during a periodic memory refresh.

At block 408, a check is made to determine if the recently-refreshed memory module is a master or a slave memory module. If the memory module to be refreshed is a master, a check is made (block 410) to determine if a time equal to a signal delay value has elapsed. If the memory module to be refreshed is a slave, the method 400 continues at block 414. Once the time period equal to the signal delay value elapses, the refresh signal passes to an adjacent slave memory module 314 at block 412 (for example, the slave memory module $314_{1\text{-}2}$). Once an additional time period equal to the signal delay value passes at block 414, block 416 determines whether all of the master (slave) memory modules 312 (314) in the current memory bank 306 have been refreshed during the current refresh cycle. If not all of the master (slave) memory modules 312 (314) have been refreshed, the method 400 returns to block 406. If all of the master (slave) memory modules 312 (314) have been refreshed in the current memory bank 306, the method 400 returns to block 402 to select the next memory bank 306.

This description has been presented for purposes of illustration, and is not intended to be exhaustive or limited to the form (or forms) disclosed. Variations and modifications may occur, which fall within the scope of the embodiments described above, as set forth in the following claims.

What is claimed is:

1. A method for controlling a refresh sequence for multiple memory elements within an electronic device, comprising:
    adjusting a programmable signal delay to avoid a simultaneous memory refresh between two or more of the multiple memory elements; and
    passing a refresh signal from one memory element to another memory element based on the programmable signal delay.

2. The method of claim 1, wherein adjusting the programmable signal delay further comprises calculating the programmable signal delay based on a prescribed refresh rate for the multiple memory elements.

3. The method of claim 1, wherein adjusting the programmable signal delay comprises modifying a refresh rate for the multiple memory elements such that the electronic device operates at nominal current levels.

4. The method of claim 1, wherein passing the refresh signal comprises routing the refresh signal through each of the multiple memory elements based on a data flow configuration.

5. The method of claim 4, wherein routing the refresh signal further comprises transferring the refresh signal from a master memory module to a slave memory module.

6. A method for refreshing memory in a memory bank, the method comprising:
    periodically issuing a refresh signal to a first memory module in the memory bank;
    after a time period equal to a programmable delay value, transferring the refresh signal to one or more additional memory modules in the same memory bank; and
    propagating the refresh signal through the entire memory bank.

7. The method of claim 6, wherein periodically issuing the refresh signal comprises modifying a memory refresh sequence to reduce instantaneous current levels.

8. The method of claim 6, wherein transferring the refresh signal further comprises propagating the refresh signal through the entire memory bank to avoid any simultaneous refreshes.

9. The method of claim 8, wherein propagating the refresh signal comprises configuring at least one memory module as a master memory module.

10. The method of claim 6, and further comprising adjusting the programmable delay value based on a prescribed refresh rate for each of the memory modules in the memory bank.

11. An electronic assembly, comprising:
   at least one data source that issues a periodic refresh signal; and
   at least one memory bank responsive to the data source, the at least one memory bank including:
      one or more memory controllers associated with an individual memory array, the one or more memory controllers adapted to propagate the periodic refresh signal through the at least one memory bank such that each memory controller refreshes each associated individual memory array during a different time period.

12. The assembly of claim 11, wherein the at least one data source is responsive to a device manager that manages a data flow configuration.

13. The assembly of claim 12, wherein the device manager routes the periodic refresh signal between at least one input selector and at least one output selector based on the data flow configuration.

14. The assembly of claim 11, wherein the at least one data source and the at least one memory bank reside on a single electronic circuit card assembly.

15. The assembly of claim 11, wherein the at least one data source is one of an application-specific integrated circuit, a field-programmable gate array, a field-programmable object array, and a programmable logic device.

16. The assembly of claim 11, wherein the one or more memory controllers comprise DDR SDRAM memory controller elements.

17. The assembly of claim 11, wherein each of the one or more memory controllers comprise a reconfigurable memory element.

18. The assembly of claim 17, wherein the reconfigurable memory element includes:
   a master memory controller, and
   a slave memory controller, each master memory controller issuing the periodic refresh signal to an adjacent slave memory controller.

19. The assembly of claim 11, wherein the one or more memory controllers propagate the periodic refresh signal based on a programmable delay value.

20. The assembly of claim 19, wherein the programmable delay value is calculated based on a refresh rate for the one or more memory controllers.

* * * * *